(12) United States Patent
Shinozaki et al.

(10) Patent No.: US 7,423,909 B2
(45) Date of Patent: Sep. 9, 2008

(54) SEMICONDUCTOR INTEGRATED CIRCUIT DEVICE

(75) Inventors: Masao Shinozaki, Kodaira (JP); Daisuke Shimadu, Kodaira (JP)

(73) Assignee: Renesas Technology Corp., Tokyo (JP)

( * ) Notice: Subject to any disclaimer, the term of this patent is extended or adjusted under 35 U.S.C. 154(b) by 0 days.

(21) Appl. No.: 11/349,196

(22) Filed: Feb. 8, 2006

(65) Prior Publication Data

US 2006/0181955 A1    Aug. 17, 2006

(30) Foreign Application Priority Data

Feb. 16, 2005    (JP) .............................. 2005-038650

(51) Int. Cl.
*G11C 11/34*    (2006.01)
(52) U.S. Cl. ............................. 365/185.23; 365/185.23; 365/230.06
(58) Field of Classification Search ............ 365/185.23, 365/185.28, 230.06
See application file for complete search history.

(56) References Cited

U.S. PATENT DOCUMENTS 5,359,572 A * 10/1994 Sato et al. .............. 365/230.03
5,943,289 A * 8/1999 Ahn et al. .............. 365/230.06
6,515,905 B2 * 2/2003 Hikida ..................... 365/185.2

FOREIGN PATENT DOCUMENTS

JP    2004-206745    12/2002

* cited by examiner

*Primary Examiner*—Huan Hoang
*Assistant Examiner*—Jason Lappas
(74) *Attorney, Agent, or Firm*—Reed Smith LLP; Stanley P. Fisher, Esq.; Juan Carlos A. Marquez, Esq.

(57) ABSTRACT

A semiconductor integrated circuit device provided with a memory circuit having a word line selection circuit with reduced leakage current is provided. The memory circuit includes: second word lines with which memory cells are connected; multiple bit lines that are extended in a direction orthogonal thereto and electrically connected with memory cells corresponding to selected second word lines of a plurality of the second word lines; and word drivers, constructed of CMOS inverter circuits, that select or deselect the second word lines. The sources of p-channel MOSFETs that constitute a plurality of word drivers including second word lines corresponding to selected bit lines are supplied with a voltage at a level at which second word lines are selected. The sources of the p-channel MOSFETs of the other word drivers are supplied with a voltage corresponding to a level at which second word lines are deselected.

7 Claims, 10 Drawing Sheets

SEMICONDUCTOR INTEGRATED CIRCUIT DEVICE

CROSS-REFERENCE TO RELATED APPLICATION

The present application claims priority from Japanese patent publication No. 2005-038650 filed on Feb. 16, 2005, the content of which is hereby incorporated by reference into this application.

BACKGROUND OF THE INVENTION

The present invention relates to a semiconductor integrated circuit device, and in particular to a technology effectively applicable to that provided with a memory circuit, such as a static RAM.

As the power consumption of LSIs (Large Scale Integrated circuits) is reduced and the transistors (MOSFETs) in LSIs are microminiaturized, the power supply voltages of LSIs have been lowered. In a 0.13-μm process, for example, LSIs that operate on a power supply voltage of 1.2V are manufactured. In a case where the power supply voltage of LSI is lowered, the following measure is taken to prevent circuit performance (the operating speed of circuit) from being degraded: the threshold voltage (hereafter, abbreviated as "Vth") of transistors is lowered to increase the current of the transistors. In a 0.13-μm process, for example, MOSFETs whose Vth is 0.4V or so are used. In a transistor low in Vth, a current, called subthreshold current, that is passed between source and drain when a transistor is off is increased. Even when a circuit constructed of that transistor is not operating, this current continues to flow. The current makes a current that is consumed in a state in which LSI is energized but is not operating (hereafter, referred to as "standby state"). In a memory circuit in which data must be stored even in standby state, power supply cannot be interrupted even in standby state. For this reason, the following problem arises in a memory circuit: when transistors constituting the circuit are reduced in Vth, the subthreshold current is increased and this leads to increased power consumption on standby.

In an SRAM (Static Random Access Memory) circuit, consequently, leakage currents can be reduced by controlling source line potential. There are SRAM circuits so constructed that the following is implemented: a circuit that controls source line potential is constructed of three elements, a switch for fixing the potential of source lines at ground potential, a diode connected MOS transistor for determining a potential, and a resistor through which a current is constantly passed; the source line potential in memory cells is thereby controlled without consuming power in a control circuit; a source line potential control circuit with variations in manufacturing process taken into account is obtained by using three elements. An example of such SRAM circuits is disclosed in Japanese Unexamined Patent Publication No. 2004-206745.

[Patent Document 1] Japanese Unexamined Patent Publication No. 2004-206745

SUMMARY OF THE INVENTION

Figure 16:
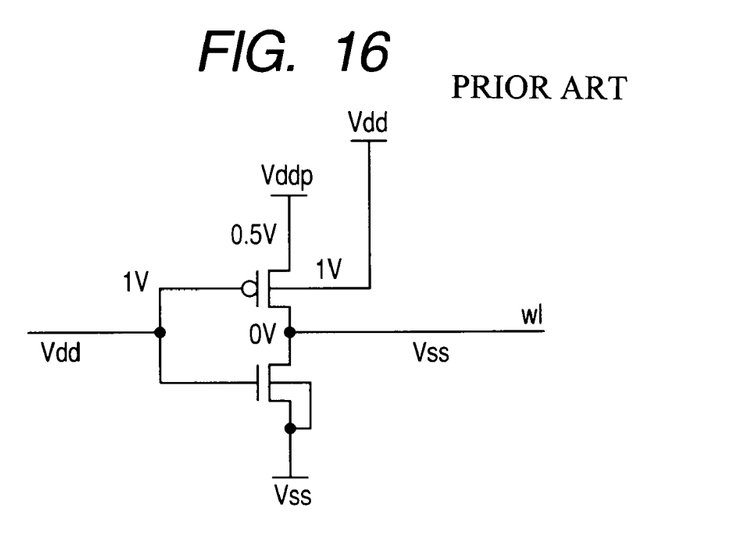
FIG. 16 is a circuit diagram of the word driver described in Patent Document 1.

FIG. 16 is a drawing illustrating a word driver circuit in an SRAM circuit disclosed in Patent Document 1. In standby state, the input of the word driver is power supply voltage Vdd, and it brings the n-channel MOSFET in the word driver into on state. The ground potential Vss of the circuit is outputted, and a word line wl is brought to the low level. As a result, a memory cell is in a state in which it is not accessed. In this state, the p-channel MOSFET in the word driver is off, and the subthreshold current passed through this MOSFET becomes a leakage current. Therefore, it is required to reduce this current.

FIG. 16 shows the relation of power supply that is established when Vddp is lowered to 0.5V or so with the power supply voltage being 1.0V. The gate potential of the p-channel MOSFET is 1.0V; the source potential is 0.5V; the drain potential is 0V; and the back gate potential is 1.0V. For this reason, in the p-channel MOSFET, the source-drain potential is 0.5V, and the MOSFET has a substrate bias of 0.5V applied thereto. Further, 0.5V is applied to between gate and source. Thus, the leakage current can be greatly reduced to 1/10000 or so as compared with a state in which the source potential is 1.0V. The potential of a power supply line Vddp can be reduced to 0.5V or so on standby by using two p-channel MOSFETs arranged in parallel for such Vddp control. More specific description will be given. One of MOSFETs arranged in parallel is turned off on standby by a control signal, and the other MOSFET is constantly kept on on standby. Thus, a current at such a level that the potential of the power supply line Vddp becomes 0.5V is continuously passed on standby.

In the technique disclosed in Patent Document 1, such a control signal as mentioned above is provided, and the reduction of leakage current is accomplished by power supply control. For this reason, an operating current due to the amplitude of the control signal and the like is produced. Therefore, varying the above control signal from memory cycle to memory cycle in synchronization with a clock signal or the like not only increases operating currents due to the amplitude of the control signal and the like. Alternately changing the potential of the power supply line Vddp, which has a relatively large parasitic capacitance because a large number of word drivers are connected, to 0.5V and to 1.0V, as mentioned above, poses a problem of increased current consumption. In addition, it is not practical in terms of the time required to switch word lines between selected state and deselected state. For this reason, the technique disclosed in Patent Document 1 brings about the power consumption reducing effect only when standby state is established for a certain period or longer.

An object of the present invention is to provide a semiconductor integrated circuit device provided with a memory circuit having a word line selection circuit with reduced leakage currents. The above and other objects and novel features of the invention will be apparent from the description in this specification and the accompanying drawings.

The following is a brief description of the gist of the representative elements of the invention laid open in this application. The present invention includes: multiple first word lines; second word lines that are extended in parallel with the first word lines and are plurally assigned to the first word lines; multiple memory cells connected with the second word lines; multiple bit lines that are extended in a direction orthogonal to the second word lines and are electrically connected with memory cells corresponding to selected second word lines of the above multiple second word lines; and word drivers constructed of CMOS inverter circuits that select or deselect the second word lines. A voltage corresponding to the level at which second word lines are selected is supplied to the sources of p-channel MOSFETs that constitute multiple word drivers including second word lines corresponding to selected bit lines. The sources of p-channel MOSFETs of the other word drivers are supplied with a voltage corresponding to the level at which second word lines are deselected.

Leakage currents can be interrupted in a large number of word drivers other than multiple word drivers including second word lines corresponding to selected bit lines.

DETAILED DESCRIPTION OF THE PREFERRED EMBODIMENTS

Figure 4:
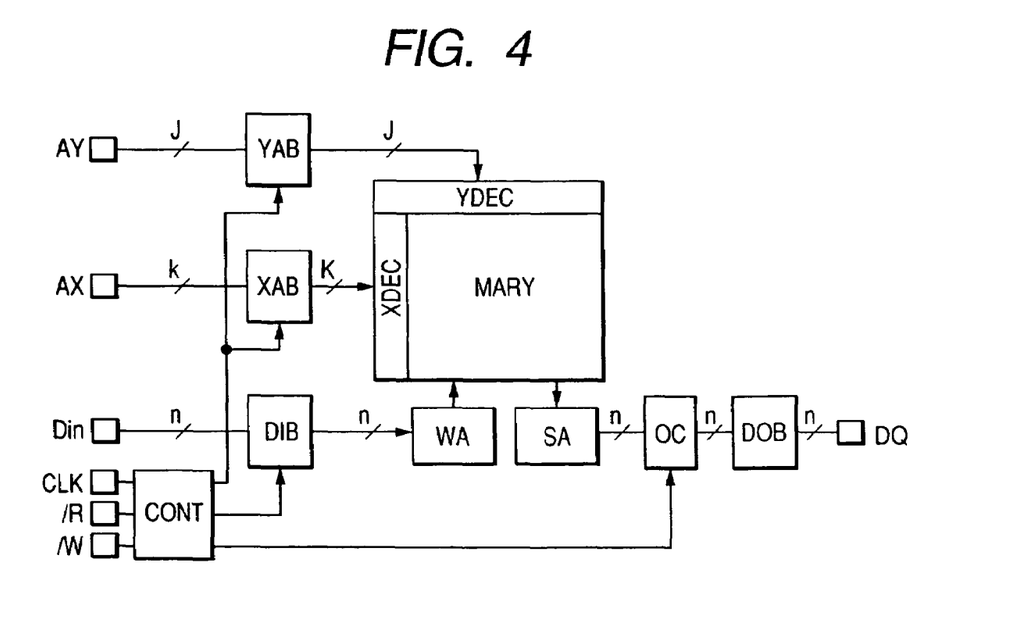
FIG. 4 is a block diagram illustrating an embodiment of SRAM to which the present invention is applied.

FIG. 4 is a block diagram of an embodiment of SRAM to which the present invention is applied. In the drawing, AX denotes X (row) address signal; AY denotes Y (column) address signal; Din denotes data input signal; CLK denotes clock signal; /R denotes read control signal; /W denotes write control signal; and DQ denotes data output signal. XAB denotes X address buffer, and YAB denotes Y address buffer. XDEC denotes X (row) decoder, which includes the predecoders and the word drivers described later. YDEC denotes Y (column) decoder, which includes the Y selection switch and the like described later. MARY denotes memory array, which is constructed by disposing static memory cells at the points at which the word lines and the bit lines intersect.

DIB denotes input buffer that takes in data input signals Din, and DOB denotes output buffer that sends out output signals. A write signal taken into the input buffer DIB is written into a selected memory cell in the memory array MARY through a write amplifier WA. SA denotes sense amplifier, which senses a read signal from a selected memory cell in the memory array MARY. The output signal of this sense amplifier SA is amplified and outputted through an output control circuit OC and the output buffer DOB. CONT denotes control circuit, which receives the above signals CLK, /R, and /W and forms control signals corresponding to memory operation.

Figure 5:
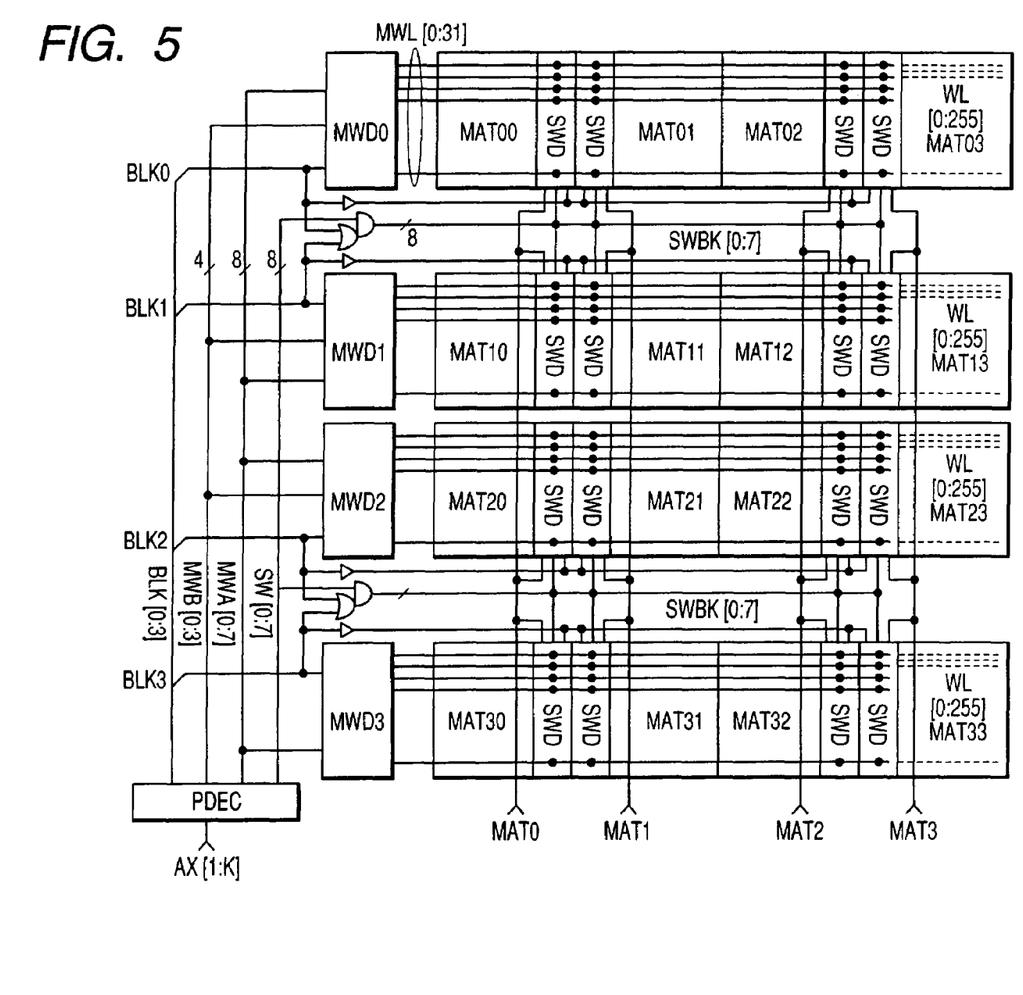
FIG. 5 is a block diagram illustrating an embodiment of the memory array MARY of the SRAM in FIG. 4 and its selection circuit.

FIG. 5 is a block diagram of the memory array MARY of the SRAM in FIG. 4 and its selection circuit. The memory array MARY is divided into four blocks in the direction of word line, and divided into four blocks in the direction of bit line. Thus, the memory array MARY is divided into 16 blocks (=4×4), or mats MAT00 to MAT33. The 4×4 mats are selected by selection signals BLK0 to BLK3 with respect to the direction of bit line and selected by selection signals MAT0 to MAT3 with respect to the direction of word line. The selection signals BLK0 to BLK3 are formed by decoding the address signals at the highest two bits of an X address signal AX with the predecoder PDEC. Though omitted in the drawing, the selection signals MAT0 to MAT3 are also formed by decoding the address signals at the highest two bits of a Y address signal with the predecoder.

The four blocks, each constructed of four memory mats MAT0 to MAT03 in the direction of word line, are respectively provided with main word drivers MWD0 to MWD3. These main word drivers MWD0 to MWD3 select 32 main word lines (first word lines) MWL, 0 to 31. The main word lines MWL are extended so that they penetrate mats MAT0 to MAT3, for example, memory mats MAT0 to MAT03, existing in one block. In each of the mats MAT00 to MAT03, MAT10 to MAT13, MAT20 to MAT23, and MAT30 to MAT33, eight sub-word lines (second word lines) WL are assigned to each main word line MWL. Therefore, each of the mats MAT0 to MAT33 is provided with 256 (=32×8) sub-word lines WL.

With respect to the mats MAT00 to MAT03 corresponding to selection signal BLK0, sub-word drivers SWD are disposed back to back in mirror arrangement in mat MAT00 and mat MAT01 adjacent thereto. Sub-word drivers SWD are similarly provided also in another memory mat MAT02 and mat MAT03 adjacent thereto. This is the same with the other mats MAT10 to MAT33 corresponding to each of selection signals BLK1 to BLK3.

The sub-word drivers SWD receive selection signals for the main word lines MWL, sub-word line selection signals SWBLK [0:7] for selecting one from among the eight sub-word lines WL, as described later, and the selection signals BLK0 to BLK3 and MAT0 to MAT3. The sub-word drivers SWD bring the sub-word lines WL of one mat MAT of the 16 mats MAT00 to MAT33 into selected state and the others into deselected state. For this selecting operation, the main word drivers MWD0 to MWD3 receive predecode signals MWB [0:3] and MWA[0:7] formed at the predecoder PDEC, and selects one of the 32 main word lines MWL (1/32 (=4×8)).

The predecode signals SW[0:7] formed at the predecoder PDEC are signals for selecting the eight sub-word lines WL assigned to one main word line. The signals are so disposed that they are extended in the direction of word line between mats MAT00 and MAT10 corresponding to selection signals BLK0 and BLK1 and the like. They are similarly extended in the direction of word line between mats MAT20 and MAT30 corresponding to selection signals BLK2 and BLK3 and the like. The signals are respectively combined with selection signals MAT0 and MAT1 and with selection signals MAT2 and MAT3, and supplied to sub-word drivers SWD.

Figure 6:
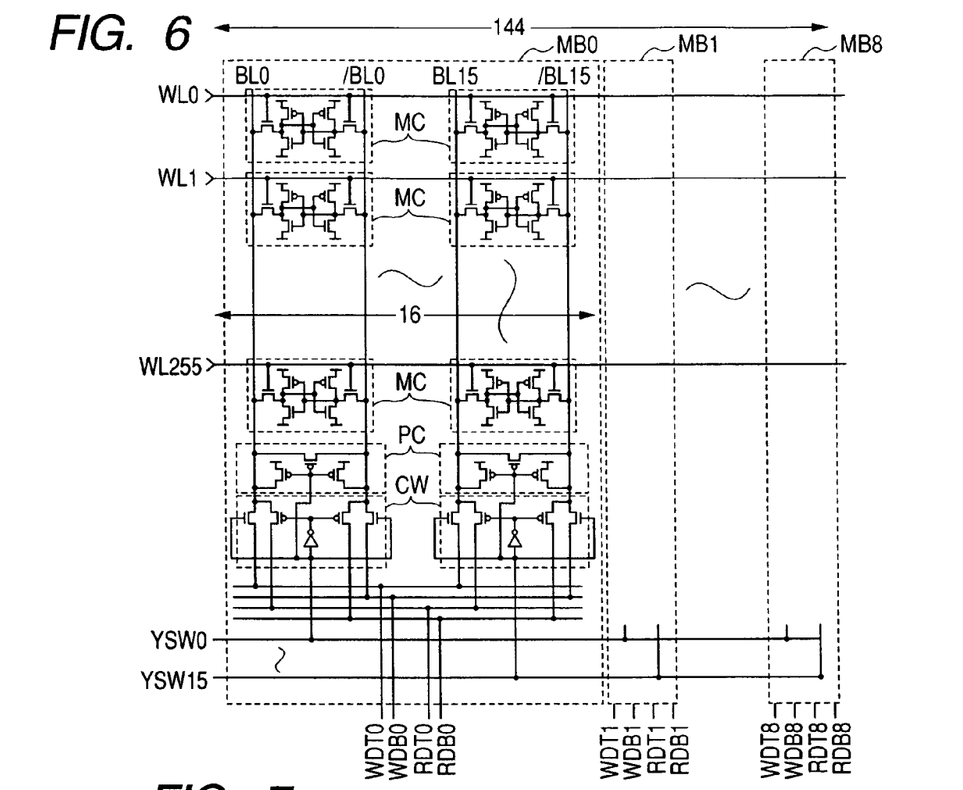
FIG. 6 is a circuit diagram illustrating an embodiment of the memory array portion in one mat in FIG. 4.

FIG. 6 is a circuit diagram of an embodiment of the memory array portion of one mat in FIG. 4. As an example, the drawing representatively shows six memory cells MC provided at the intersections of three sub-word lines WL0, WL1, and WL255 and two pairs of complementary bit lines BL0 and /BL0 and BL15 and /BL15. Each memory cell MC is constructed of: a latch circuit (storage portion) formed of a CMOS inverter circuit whose input and output are cross-connected; and n-channel selection switch MOSFETs provided between a pair of storage nodes thereof and complementary bit lines BL0 and /BL0. The gates of the selection switch MOSFETs are connected with sub-word line WL0. In this embodiment, 16 pairs of complementary bit lines BL0 and /BL0 . . . BL15 and /BL15 constitute one memory block MB0 and nine blocks, MB0 to MB8, in total are provided, though the present invention is not especially limited to this construction. Data is written and read on the basis of nine bits, constructed of one byte (eight bits) of data and one parity bit, such as error detection bit, by selecting one memory cell from each of the nine blocks MB0 to MB8.

Between the complementary bit lines BL0 and /BL0 . . . BL15 and /BL15, the following are provided: a precharge circuit PC, constructed of a p-channel MOSFET that short-circuits them and a p-channel MOSFET that supplies power supply voltage; and a column switch circuit CW comprising an n-channel MOSFET that connects the complementary bit lines BL0 and /BL0 . . . BL15 and /BL15 and the write data lines WDT0 and WDB0 at the zeroth bit, and a p-channel MOSFET that connects the complementary bit lines BL0 and /BL0 . . . BL15 and /BL15 and the read data lines RDT0 and RDB0 at the zeroth bit. These precharge circuits PC and the column switch circuits CW are provided with Y selection signals YS0 to YS15 formed at the decoder YDEC. With respect to the other memory blocks MB1 and MB8 shown as an example, the write data lines WDT1 and WDB1 and WDT8 and WDB8 at the first bit and eighth bit correspond to the foregoing, and the read data lines RDT1 and RDB1 and RDT8 and RDB8 at the first bit and eighth bit correspond to the foregoing.

Figure 7:
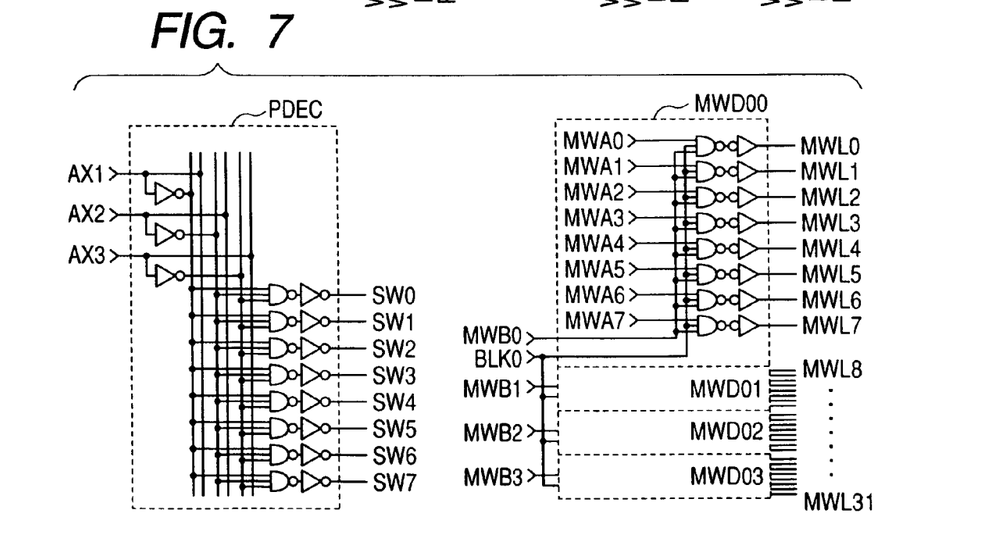
FIG. 7 is a circuit diagram illustrating an embodiment of the predecoder and a main word driver in FIG. 5.

FIG. 7 is a circuit diagram of an embodiment of the predecoder and a main word driver in FIG. 5. Three-bit address signals AX1 to AX3 and their inversion signals are formed at inverter circuits, and sub-word line selection signals SW0 to SW7 are formed through three-input gate circuits. The main word driver MWD0 is divided into four blocks, MWD00 to MWD03, and eight main word lines, for example, MWL0 to MWL7, are assigned to each of them, as representatively illustrated as an example. The predecode signals MWA0 to MWA7 of the three-bit address signals are supplied to the blocks MWD00 to MWD03 divided into four, and each block is supplied with block selection signals BLK0 to BLK3. The main word driver MWD0 constructed of four blocks MWD00 to MWD03 is selected by the above-mentioned selection signal BLK0. Thus, one is selected from among the above-mentioned 32 main word lines MWL.

In this embodiment, as illustrated in FIG. 5, 32 main word lines are assigned to each of the four main word drivers MWD0 to MWD3. Therefore, 128 (=32×4) word lines in total exist. However, since only one main word driver is selected by one of the above selection signals BLK0 to BLK3, only one is selected from among the 128 main word lines.

Figure 1:
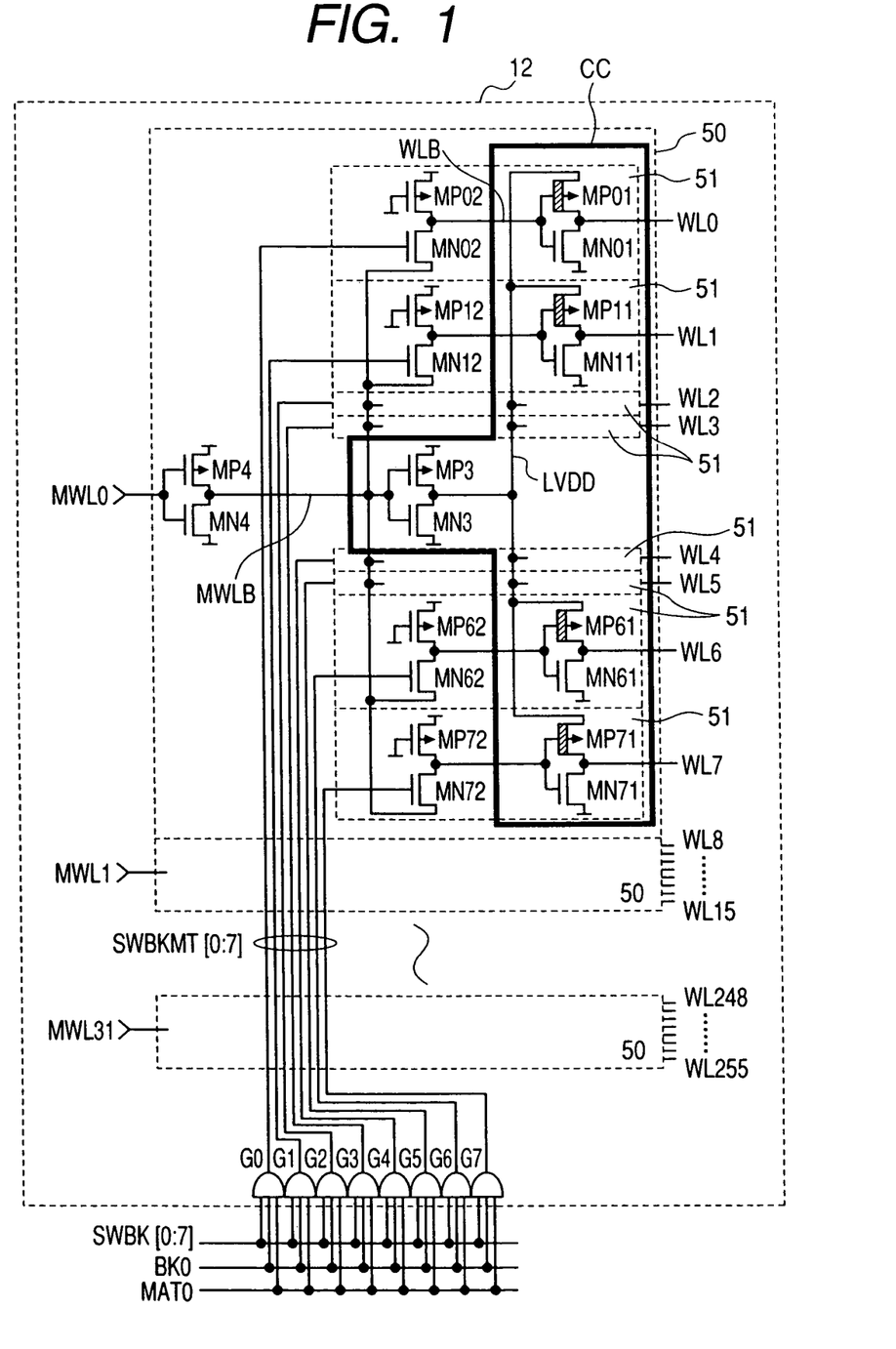
FIG. 1 is a circuit diagram illustrating an embodiment of a sub-word driver 12 corresponding to one mat MAT00 in FIG. 5.

FIG. 1 is a circuit diagram of an embodiment of the sub-word driver 12 corresponding to one mat MAT00 in FIG. 5. In the drawing, the sub-word lines WL0 to WL255 are divided into sub-driver groups 50, each constructed of eight sub-word drivers corresponding to the above-mentioned 32 main word lines MWL0 to MWL31. Of the eight sub-word lines WL0 to WL7 corresponding to one sub-driver group 50, four sub-word drivers 51 corresponding to WL0 and WL1 and WL6 and WL7 are representatively shown as an example in the drawing.

The sub-word driver 51 corresponding to the sub-word line WL0 is constructed of a series circuit of a p-channel MOSFET MP01 and an n-channel MOSFET MN01, which constitutes a CMOS inverter circuit. The source of the MOSFET MN01 is connected with the ground wire of the circuit. The drains of the MOSFETs MP01 and MN01, connected in common, are used as an output terminal, which is connected with the sub-word line WL0. The source of the MOSFET MP01 is used as a first selection terminal, and is connected in common with the sources as the first selection terminals of the remaining seven similar p-channel MOSFETs MP61, MP71, and so on corresponding to the main word line MWL0. To this common source line LVDD, a selection signal corresponding to the main word line MWL0 is transmitted through the CMOS inverter circuits MP4 and MN4 and MP3 and MN3.

The gates of the MOSFETs MM01 and MP01, connected in common, are used as a second selection terminal, which is supplied with selection signal SWBKMT0 through a drive circuit constructed of a p-channel MOSFET MP02 and an n-channel MOSFET MN02. The p-channel MOSFET MP02 of the drive circuit is supplied with ground potential at its gate and constantly kept on, and operates as a resistance element. The source of the n-channel MOSFET MN02 is connected in common with the sources of the n-channel MOSFETs MN62, MN72, and so on of the remaining seven similar drive circuits corresponding to the main word line MWL0, similarly with the foregoing. The n-channel MOSFET MN02 is supplied with the output signals MWLB of the CMOS inverter circuit MP4 and MN4, in other words, the input signals of the CMOS inverter circuit MP3 and MN3.

The above-mentioned selection signals SWBKMT[0:7] are selection signals for selecting one from among the eight sub-word lines WL assigned to one main word line MWL. They are respectively formed through the gate circuits G1 to G7 that receive one of the selection signals SWBK[0:7] for the sub-word lines and selection signals BK0 and MAT0. That is, the selection signals SWBK[0:7] are selection signals used in common for the above-mentioned 16 memory mats. The selection signal SWBKMT[0:7] is supplied only to a sub-word driver corresponding to one mat MAT according to the combination of the selection signals BK0 and MAT0. This selection signal SWBKMT[0:7] is used in common for sub-driver groups 50 corresponding to the main word lines MWL0 to MWL31 in the relevant mat.

When one MWL0 of the main word lines MWL0 to MWL31 is brought to the high level at which selection is made, the output signal MWLB of the CMOS inverter circuit (MP4 and MN4) that receives it is brought to the low level, and the eight drive circuits are brought into operating state. Then, the output signal of the CMOS inverter circuit (MP3 and MN3) is brought to the high level, and the common source line LVDD of the eight sub-word drivers 51 is brought to the high level, such as power supply voltage. When any one selection signal SWBKMT0 of the selection signals SWBKMT[0:7] supplied to the mat MAT00 is brought to the high level, the n-channel MOSFET MN02 is turned on. Thus, the p-channel MOSFET MP01 is turned on, and the high level, such as power supply voltage, of the common source line LVDD is transmitted to the word line WL0, which is then brought into selected state.

In the remaining seven sub-word drivers corresponding to the main word line MWL0, at this time, the n-channel MOSFETs MN12, MN62, MN72, and so on of the drive circuits are off because of the selection signals SWBKMT[1:7] being at the low level. Therefore, the output signals of the drive circuits at the high level are transmitted to the gates as the second selection terminal of the sub-word driver through the p-channel MOSFETs MP12, MP62, and MP72. Thus, in the individual drivers, the n-channel MOSFETs MN11, MN61, MN71, and so on are turned on, and the word lines WL1 to WL7 are brought to the low level, that is, into deselected state.

In this embodiment, the p-channel MOSFETs MP01, MP11, MP61, and MP71 that constitute sub-word drivers so constructed that they have the lowest threshold voltage formed in their process. Thus, even when elements are microminiaturized and their voltages are lowered, large driving currents are obtained, and the operation of selecting the word lines WL0 to WL7 and the like can be accelerated. Meanwhile, in the seven sub-word drivers corresponding to deselected word lines WL1 to WL7, a relatively large leakage current is passed through the p-channel MOSFETs MP11, MP61, MP71, and so on in off state, as mentioned above. In this embodiment, however, the above leakage current is passed only through the seven sub-word drivers, as mentioned above.

That is, in the mat MAT00, the common source lines LVDD of the other sub-word drivers groups 50 are at the low level in correspondence with that the main word lines MWL1 to MWL31 corresponding thereto are at the low level. Thus, the leakage currents in the above sub-word drivers are blocked. In each of the remaining 15 deselected mats MAT01 to MAT33, similarly, all of the main word lines MWL0 to MWL31 are brought into deselected state. Therefore, the common source lines LVDD of the individual sub-word driver groups 50 are brought to the low level in correspondence with that the main word lines MWL0 to MWL31 are at the low level, similarly with the foregoing. The leakage currents in the above sub-word drivers are thereby blocked. The result is that a leakage current is passed only through seven sub-word drivers of the 4096 (=256×16) sub-word drivers in total. Therefore, the leakage current can be significantly reduced in the entire memory circuit.

Also, with respect to the drive circuits that drive the sub-word drivers, a leakage current is passed only through the seven drive circuits in which the n-channel MOSFETs MN12 to MN72 are off. More specific description will be given. When a main word line MWL is brought to the low level, the source potential of the n-channel MOSFETs of drive circuits corresponding thereto is brought to the high level, such as power supply voltage. A direct current is thereby prevented from being passed between the p-channel MOSFETs and the n-channel MOSFETs that constitute the drive circuits.

The sub-word lines WL are connected with so large a number of memory cells as 144 (=16×9) and thus have a large load capacity. The parasitic capacitance of the above common source lines LVDD and MWLB is lower than the sub-word lines WL. For this reason, the CMOS inverter circuits MP3 and MN3 and MP4 and MN4 are so constructed that they have a larger threshold voltage as compared with the MOSFETs MP01, MN01, and soon that constitute the above sub-word drivers for the purpose of leakage current reduction. Thus, as the result of increase in threshold voltage, the leakage current can be reduced to a level at which it is negligible also in the above drive circuits and the CMOS inverter circuits that receive the signals of the main word lines MWL.

Figure 2:
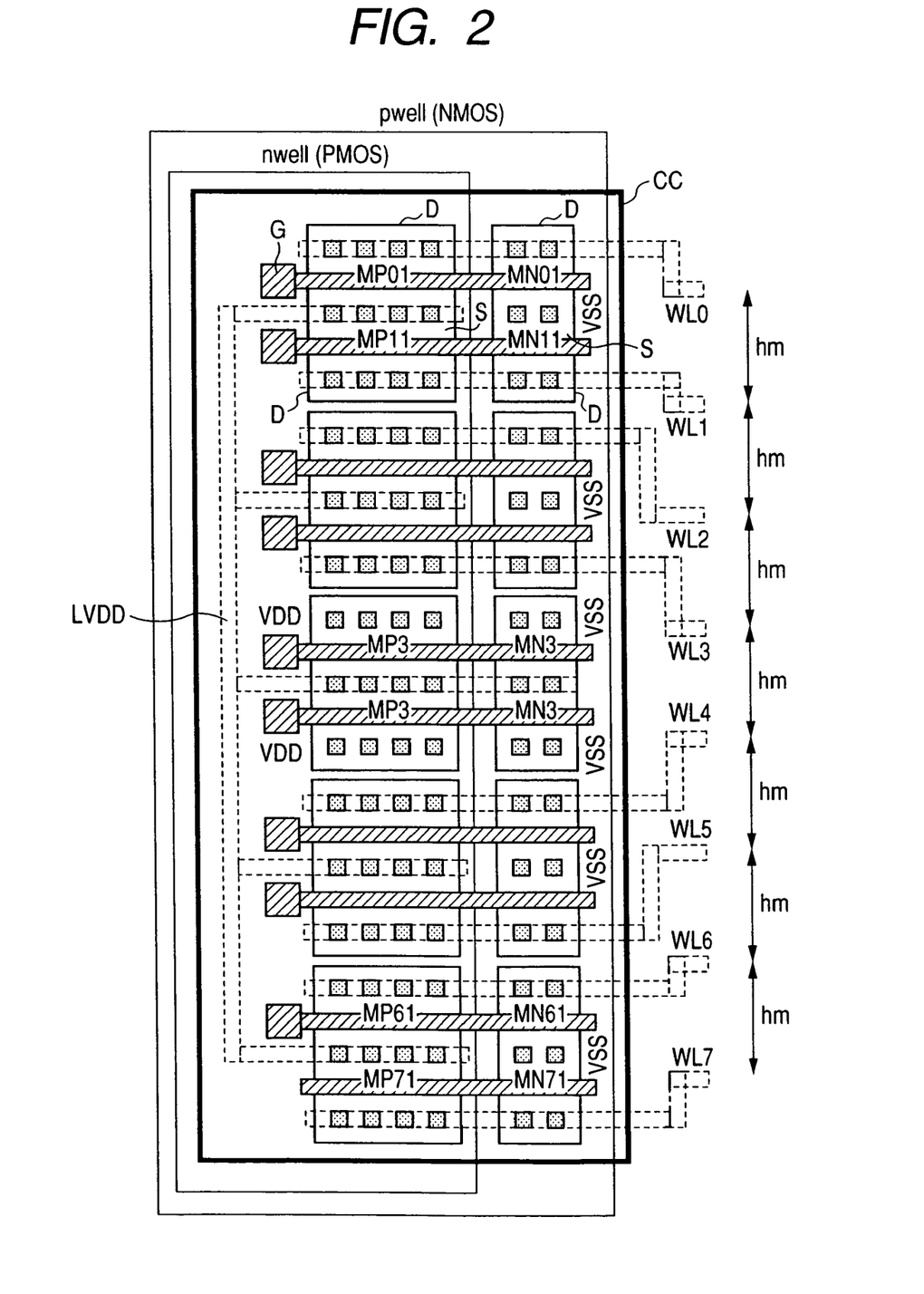
FIG. 2 is a layout chart illustrating an embodiment of a unit circuit unit in FIG. 1.

In this embodiment, higher levels of integration and speed-ups are achieved by taking the following measure: the above-mentioned eight sub-word drivers and the CMOS inverter circuit MP3 and MN3 corresponding thereto are taken as one unit circuit unit CC, and the layout illustrated in FIG. 2 is adopted.

FIG. 2 is a layout chart of an embodiment of the unit circuit unit in FIG. 1. In this embodiment, the above eight sub-word drivers and the CMOS inverter circuit that drives their common source line LVDD are constructed as one unit circuit unit CC. The unit circuit unit CC is so constructed that p-channel MOSFETs (PMOSs) are formed in an n-type well region nwell and n-channel MOSFETs (NMOSs) are formed in a p-type well region pwell. These p-channel MOSFETs and n-channel MOSFETs are disposed along the direction of extension of word lines WL so that gate electrodes G are extended in straight lines. The p-channel MOSFETs are so largely formed that their gate channel width is approximately twice that of the n-channel MOSFETs.

In this embodiment, sets of two sub-word drivers corresponding to sub-word lines WL0 and WL1, WL2 and WL3, WL4 and WL5, and WL6 and WL7 adjoining to each other are paired, and the sources S are formed of a common semiconductor region. More specific description will be given. With respect to MOSFETs that constitute two sub-word drivers corresponding to the word lines WL0 and WL1, two sets of MOSFETs MP01 and MP11 and NM01 and MN11 are respectively disposed in mirror arrangement with the source region S shared therebetween. The gate electrode G is disposed on both sides of the source region S, and a drain region D is disposed on both sides of the gate electrodes so that the gate electrodes are sandwiched therebetween. These drain regions D are connected with the word lines WL0 and WL1. The common source region S of the p-channel MOSFETs MP01 and MP11 is connected with the above-mentioned common source line LVDD. The common source region S of the n-channel MOSFETs MN01 and MN11 is connected with the ground potential line VSS of the circuit. This is the same with the other sub-word lines WL2 and WL3, WL4 and WL5, and WL6 and WL7.

In the intermediate portion of the above-mentioned eight sub-word driver groups, that is, between the sub-word drivers corresponding to the sub-word lines WL3 and WL4, the MOSFETs MP3 and MN3 are provided. These MOSFETs MP3 and MN3 constitute two CMOS inverter circuits laid out in the same manner as with the above sub-word drivers. These sets of two MOSFETs are respectively arranged in parallel and constitute the above-mentioned one CMOS inverter circuit. The source regions S of the two p-channel MOSFETs MP3 and n-channel MOSFETs MN3 are formed of a common semiconductor region, and they are interconnected with the common source region S of the above-mentioned sub-word drivers. The drain regions D disposed on both sides are supplied with power supply voltage VDD. The two p-channel MOSFETs MP3 and n-channel MOSFETs MN3 are arranged in parallel. Thus, a CMOS inverter circuit that has double the current supplying capability of the sub-word drivers can be constructed.

Eight sub-word drivers and a CMOS inverter circuit that drives their common source line LVDD can be disposed using 10 p-channel MOSFETs and n-channel MOSFETs of the same circuit pattern, as mentioned above. In the sub-word drivers, the sources of the eight p-channel MOSFETs MP01 to MP71 are shared between adjacent ones. Thus, the interconnection therebetween can be omitted, and, in reality, they can be formed of source regions equivalent to four sources. Therefore, the parasitic capacitance existing therein can be reduced to approximately half. The sub-word drivers in this embodiment are so constructed that the following is implemented: the sources of the p-channel MOSFETs MP01 to MP71 are used as selection terminals, and selection signals corresponding to the level at which the word lines WL0 to WL7 are selected are supplied thereto. For this reason, the rising edge of signals brought to the level at which word lines are selected is determined by change in the voltage of the common source lines LVDD. Consequently, speedup can be achieved with reduction in the parasitic capacitance of the common source lines LVDD.

In the above-mentioned unit circuit unit, the eight sub-word lines WL0 to WL7 are arranged with an equal pitch hm so as to fill the space in the CMOS inverter circuit that constitutes the drive circuit for the common source line LVDD. In one memory mat MAT, the 32 unit circuit units CC mentioned above are arranged in correspondence with the 256 sub-word lines. Thus, the sub-word lines can be disposed with an equal pitch hm, and the memory cells MC can be correspondingly disposed with regularity. Conversely, the above-mentioned sub-word drivers can be efficiently disposed in correspondence with the disposition of the memory cells MC.

In this embodiment, the sub-word drivers and the CMOS inverter circuits that drive the common source lines LVDD are formed of MOSFETs of the same threshold voltage. In a case where they are formed of the above-mentioned MOSFETs of low threshold voltage, the following measure is taken: the source of the p-channel MOSFET MP0 or the like in the final stage of a sub-word driver is connected with a common source line LVDD. When the relevant main word line MWL is deselected, this common source line LVDD is brought to the low level. The leakage current passed through the eight MOSFETs, for example, the sub-word driver MP01 to MP71 corresponding to the deselected sub-word lines WL0 to WL7 is replaced with the leakage current of the two p-channel MOSFETs MP3 in off state in the above-mentioned drive circuit. With such layout as in this embodiment, the gate width of the blocking MOSFETs MP3 can be reduced to ¼ of the gate width of the eight MOSFETs, or the p-channel MOSFETs MP01 to MP71. Thus, the leakage current can be reduced.

Further, it is possible to shorten the common source line LVDD running from the drains of the above-mentioned MOSFETs MP3 for blocking leakage currents to the sources of the p-channel MOSFETs MP01 to MP71 of the sub-word drivers. For this reason, the parasitic resistance of the common source line LVDD can be reduced. In this embodiment, a region where the power supply interruption MOSFETs MP3 and MN3 folded back are disposed is ensured for eight sub-word drivers. Therefore, the power supply interruption MOSFETs can be disposed without increasing the chip size. Further, the parasitic diffusion capacitance of the common source lines LVDD can be reduced; therefore, the shortening of transition time when LVDD is pulled up and the reduction of current consumption can be achieved. Needless to add, the threshold voltage of the above-mentioned MOSFETs MP3 may be made higher than that of the p-channel MOSFETs MP01 to MP71 that constitute the sub-word drivers. Thus, the leakage current in the sub-word drivers can be significantly reduced, as mentioned above.

Figure 3:
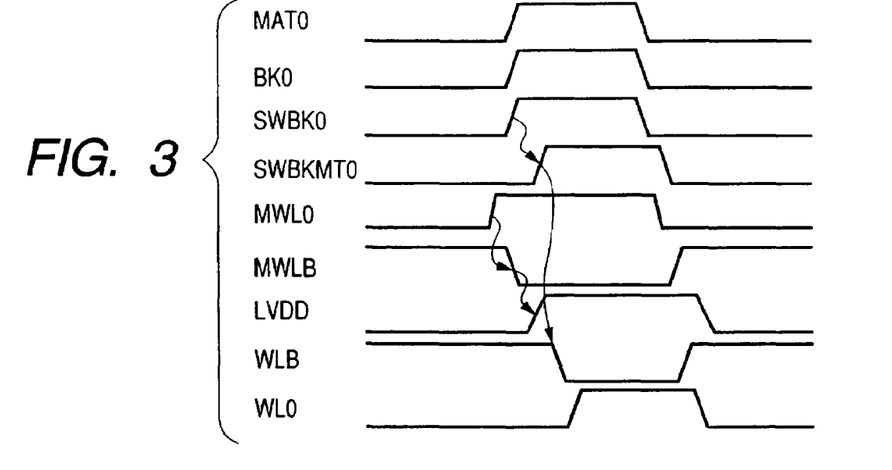
FIG. 3 is a timing chart for explaining an example of the operation of the sub-word driver in FIG. 1.

FIG. 3 is a timing chart for explaining an example of the operation of the sub-word drivers illustrated in FIG. 1. When the mat selection signal MAT0, block selection signal BK0, and sub-word line selection signal SWBK0 are brought to the high level, the sub-word line selection signal SWBKMT0 is brought to the high level by the gate circuit G0. When the main word line MWL0 is brought to the high level, the output signal MWLB of the CMOS inverter circuit in the preceding stage is brought to the low level. Because of this signal MWLB being at the low level and the above-mentioned signal SWBKMT0 being at the high level, the input signal WLB of the sub-word driver corresponding to the sub-word line WL0 is brought to the low level. In correspondence with the main word line MWL0 being at the high level, the common source line LVDD is brought to the high level by the above-mentioned drive circuit. As a result, one sub-word line WL0 is brought to the high level, that is, into selected state.

Figure 8:
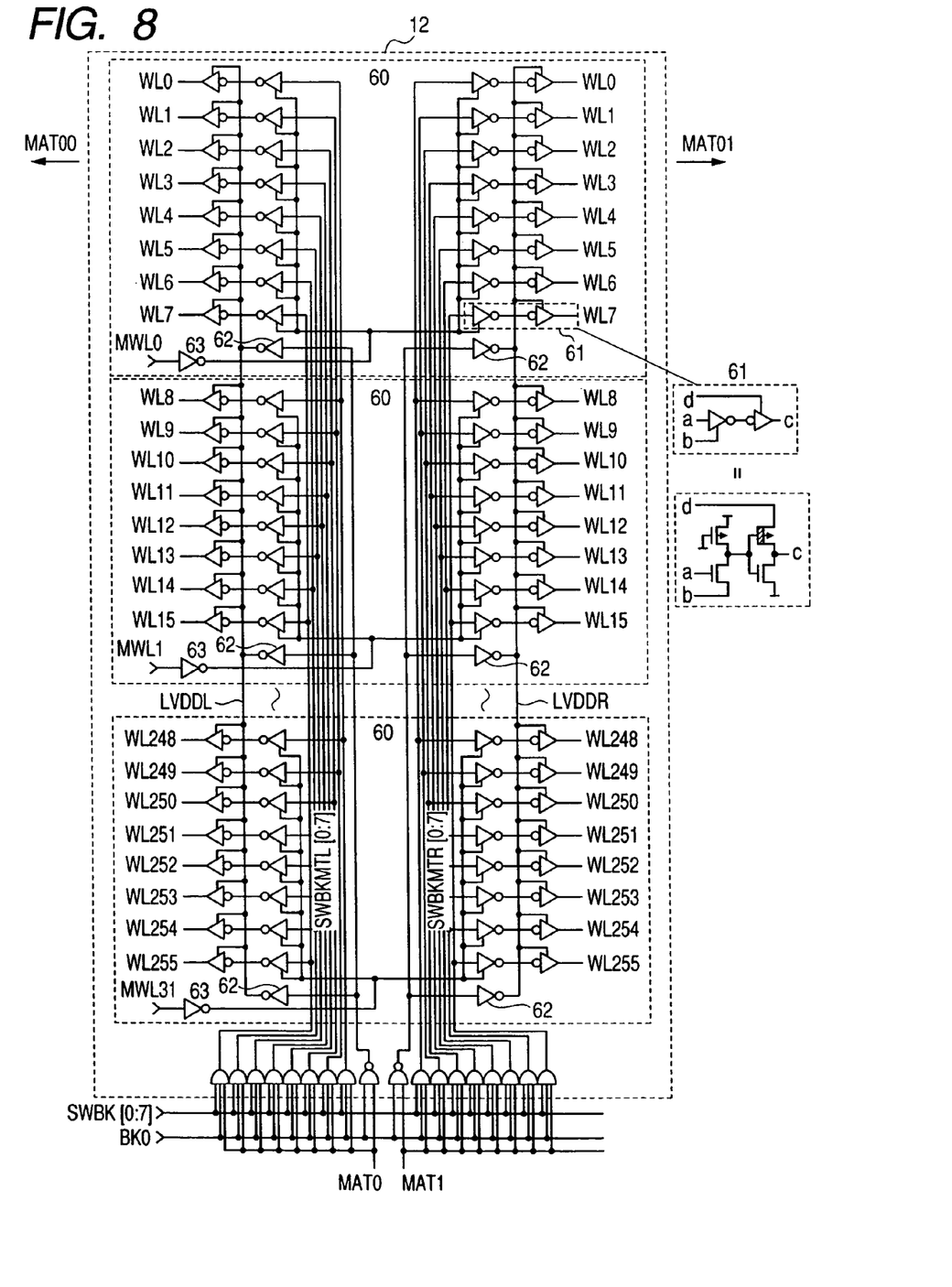
FIG. 8 is a circuit diagram illustrating another embodiment of the sub-word driver 12 corresponding to two mats MAT00 and MAT01 in FIG. 5.

FIG. 8 is a circuit diagram of another embodiment of the sub-word drivers 12 corresponding to two mats MAT00 and MAT01 in FIG. 5. This drawing in relation to this embodiment shows two sub-word drivers SWD disposed back to back, as in FIG. 5. Also, in this embodiment, the sub-word lines WL0 to WL255 of two mats MAT00 and MAT01 are divided into sub-driver groups 60, each constructed of eight sub-word drivers corresponding to the 32 main word lines MWL0 to MWL31. In this embodiment, one is selected from among two sub-decoders corresponding to the mats MAT00 and MAT01, divided into the left and right sides with respect to the sub-word driver groups 60 in the drawing, by mat selection signals MAT0 and MAT1. In this embodiment, the CMOS inverter circuits 63 that receive the main word lines MWL0 to MWL31 are shared between the above-mentioned two sub-word drivers.

In the embodiment illustrated in FIG. 1, common source lines are selected or deselected on the basis of main word line MWL. In this embodiment, they are selected or deselected on the basis of sub-word driver block selected according to a BLK selection signal and a MAT selection signal. In a case where they are selected or deselected on the basis of main word signal, the common source lines LVDD of sub-word driver circuits that are connected with the same main word line and are not selected by a MAT signal are also pulled up or pulled down. Therefore, the current consumption of charging/discharging current at these portions is wasteful. In a case where the sub-word driver, that is, the memory mat in FIG. 1 is so constructed that it is divided into a large number by combinations of BLK and MAT, the current consumption can be reduced by taking the following measure: only the common source lines LVDD in sub-word driver blocks are driven, as illustrated in the drawing. The power consumption is reduced more, for example, by dividing a mat into 8×8 than by dividing it into 4×4.

In this embodiment, one drive (interruption) circuit 62 for common source line LVDD is provided for eight small word driver blocks 61. Thirty-two (32) pieces in sub-word driver blocks selected by the same BLK and MAT are connected with common source lines LVDD. For this reason, the p-channel MOSFETs that are provided for one drive circuit 62 and for interrupting common source line power supply can be so designed that their gate width is small.

Figure 9:
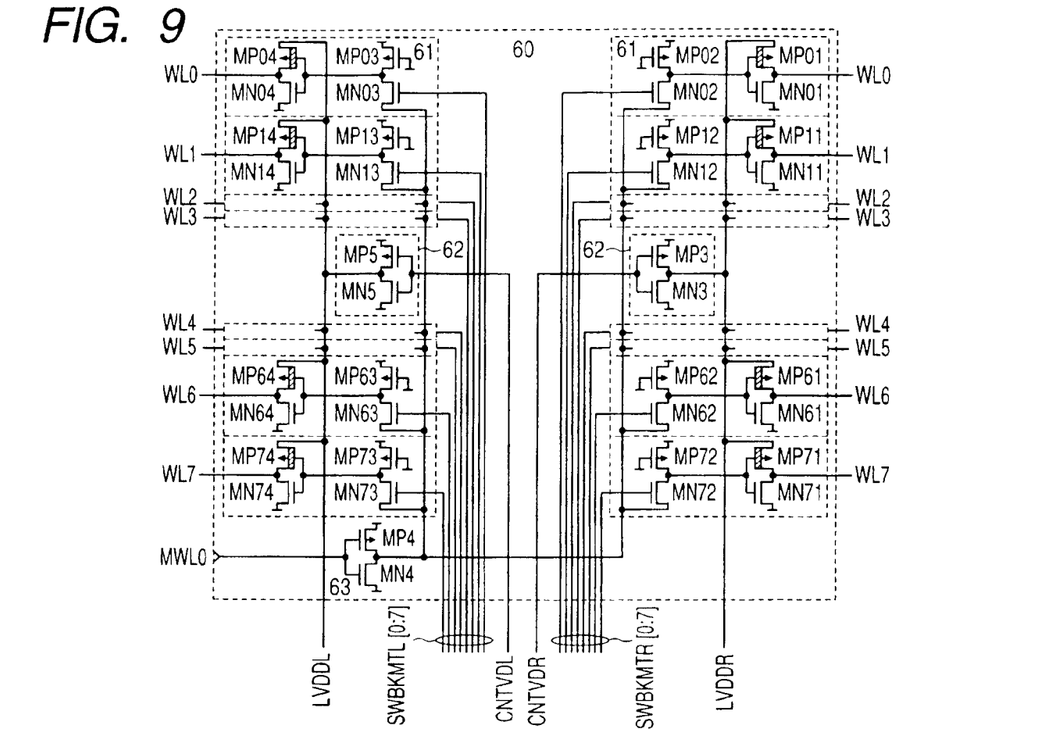
FIG. 9 is a circuit diagram illustrating an embodiment of a sub-word driver group 60 in FIG. 8.

FIG. 9 is a circuit diagram of an embodiment of a sub-word driver group 60 in FIG. 8. The eight sub-word drivers 61 and the above-mentioned CMOS inverter circuit 62 disposed on the right are the same as those in FIG. 1. Eight sub-word drivers and one CMOS inverter circuit 62 are also provided on the left symmetrically therewith. These 8×2 sub-word drivers 61 are provided with a CMOS inverter circuit 63 that receives the main word line MWL0. In this embodiment, the output signal of the CMOS inverter circuit 63 is used only to control the source potential of the n-channel MOSFETs MN02 to MN72 and MN03 to MN73 that constitute the drive circuit for the sub-word drivers 61, eight of which are respectively provided on the left and right sides. The common source lines LVDDL and LVDDR of the p-channel MOSFETs of the sub-word drivers 61 are respectively shared in correspondence with the mats MAT00 and MAT01. They are respectively driven by the CMOS inverter circuits 62 provided for each of the above-mentioned sub-driver groups 60.

Figure 10:
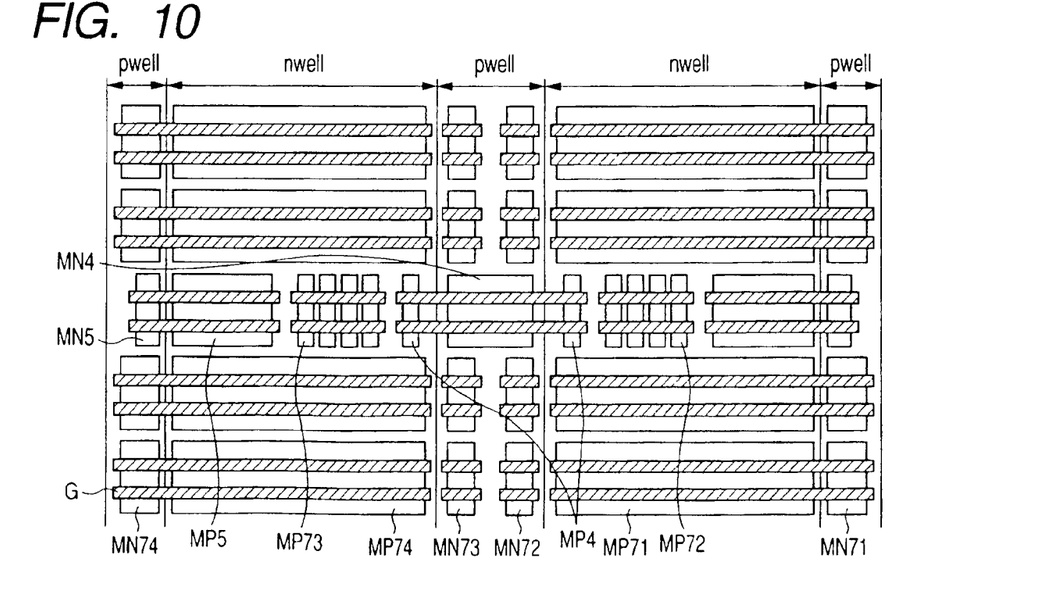
FIG. 10 is a layout chart illustrating an embodiment of the sub-word driver group in FIG. 9.

FIG. 10 is a layout chart of an embodiment of the sub-word driver group in FIG. 9. In this embodiment, the length of the common source line power supply interruption MOSFETs MP3 and MP5 is reduced to ½ or less of that of the p-channel MOSFETs MP01 to MP71 and MP04 to MP74 in the final stage of the sub-word drivers. The p-channel MOSFETs MP02 to MP72 and MP03 to MP73, provided as the above-mentioned resistance means for the sub-word drivers, are divided and disposed on the left and right sides in the resulting vacant regions. The n-channel MOSFETs MN02 to MN72 and MN03 to MN73 in correspondence with the above-mentioned p-channel MOSFETs MP02 to MP72 and MP03 to MP73 are disposed in the p-type well region pwell, provided in the center, in line with the p-channel MOSFETs corresponding to the respective sub-word drivers. In the center of the above-mentioned sub-word driver group 60, there are provided two pairs of p-channel MOSFETs and n-channel MOSFETs that constitute the CMOS inverter circuit 63 that receives the above-mentioned main word line MWL. They are connected in parallel and used in common by the left and right sub-word driver groups. Thus, it is possible to efficiently lay out all the MOSFETs required to select eight sub-word lines WL0 to WL7 corresponding to each of the mats MAT00 and MAT01 in FIG. 9.

Figure 11:
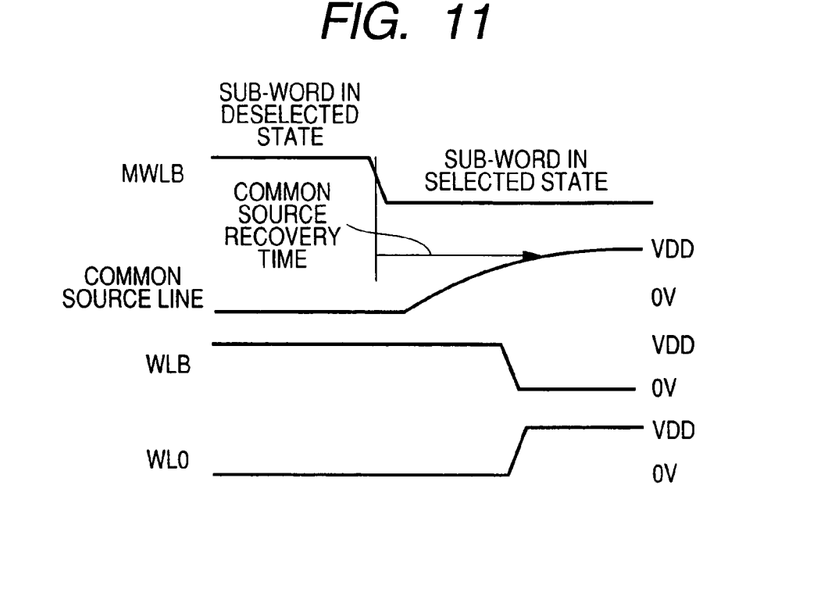
FIG. 11 is a characteristic diagram for explaining the dependence of common source recovery time on leak block MOS size according to the present invention.

In a case where the sub-word drivers of the above-mentioned SRAM are further microminiaturized and manufactured in a 90-nm CMOS process, the following result was obtained by estimation by the present inventors: in case of a 72M-bit SRAM, in sub-word drivers not provided with the above-mentioned blocking MOSFETs, the leakage current would reach so high a value as 70 mA. When the transistor gate width of the sub-word drivers is reduced to reduce the leakage current to cope with this, the delay time is, in turn, increased. Therefore, to reduce the leakage current without degradation in delay time as in the above embodiment, the sources of the p-channel MOSFETs of multiple word drivers are unified and a leak block MOSFET is connected thereto. In this case, as illustrated in the timing chart in FIG. 11, the gate voltage MWLB of the leak block MOSFET is caused to fall down when the relevant sub-word driver group is selected. Then, the common source line is recovered from 0V to VDD voltage. Unless the common source line sufficiently rises, the word line WL0 cannot be driven. Therefore, it is required to enhance the common source recovery time as much as possible.

Figure 12:
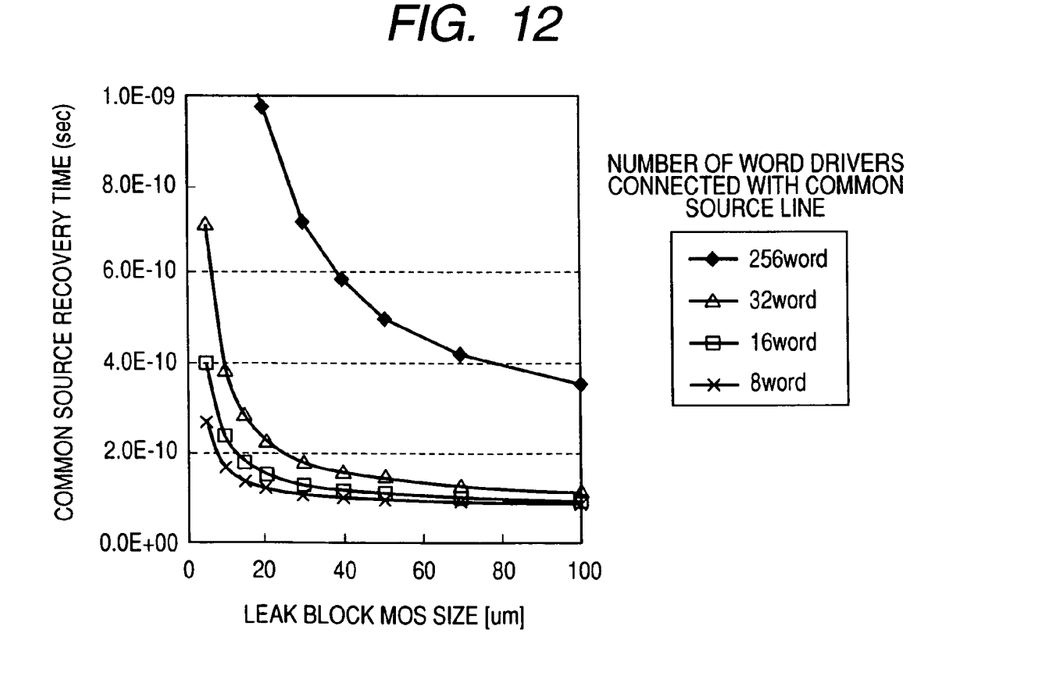
FIG. 12 is a characteristic diagram for explaining the dependence of common source recovery time on leak block MOS size according to the present invention.

FIG. 12 is a characteristic diagram for explaining the dependence of common source recovery time on leak block MOS size. As the number of sub-word drivers connected with a common source line is increased, the parasitic capacitance of the diffusion layers in the source portions of the sub-word drivers is increased, and thus the recovery time is lengthened. A large leak block MOSFET is required for reducing it but a large leak block MOSFET poses a problem. The area of occupation by the sub-word drivers in layout is increased, and this drives up the cost of manufacturing chips. In this embodiment, the following advantages are brought by sharing a source diffusion region between two adjoining sub-word drivers as in the embodiments illustrated in FIG. 2 and FIG. 10: the above-mentioned parasitic capacitance can be decreased by half, and further the quantity of wiring connecting them can also be halved. Therefore, the shortening of the above-mentioned source recovery time, that is, the speedup of memory selection operation can be achieved.

Figure 13:
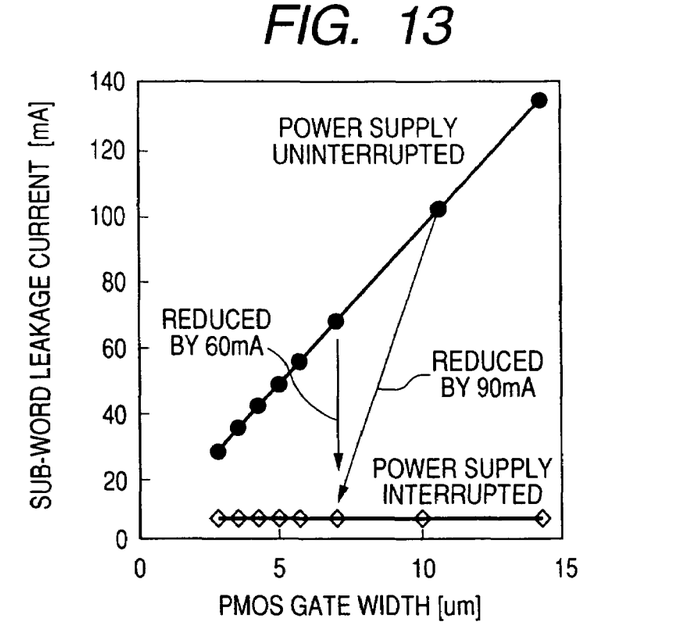
FIG. 13 is a characteristic diagram for explaining the relation between the gate width of the p-channel MOSFET of a sub-word driver and sub-word leakage current according to the present invention.

FIG. 13 is a characteristic diagram for explaining the relation between the gate width of the p-channel MOSFETs of sub-word drivers and sub-word leakage current. FIG. 13 illustrates an example of the leakage current reduction effect produced by interruption of power supply to sub-word drivers. Without such blocking MOSFETs as in this embodiment, the leakage current is increased in proportion to the size of p-channel MOSFET. With current blocking MOSFETs, meanwhile, the leakage current can be reduced by a certain amount regardless of p-channel MOSFET size. In a case where high priority is given to reduction in chip size and the size of p-channel MOSFETs is reduced to a relatively small value, for example, it can be reduced by 60 mA. In a case where priority is given to speedup (shortening of delay time) and the size of p-channel MOSFETs is increased, it can be reduced by 90 mA.

Figure 14:
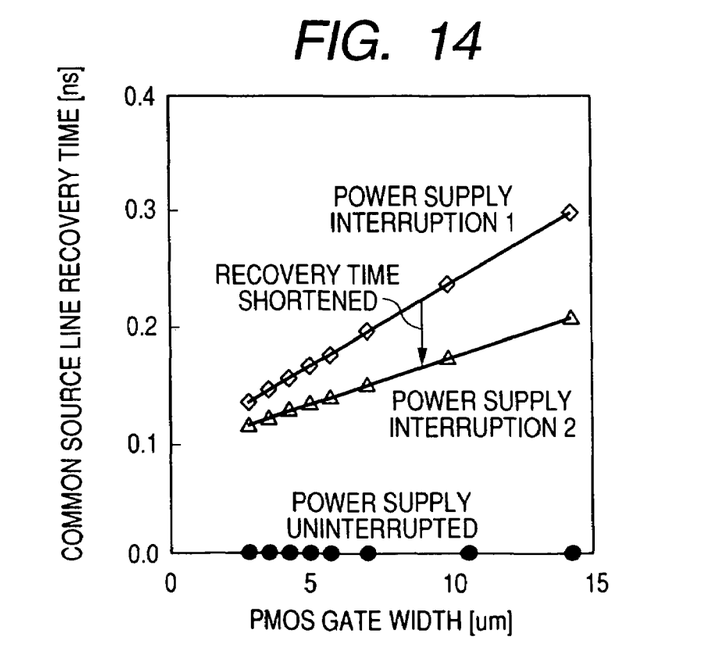
FIG. 14 is a characteristic diagram for explaining the relation between the gate width of the p-channel MOSFET of a sub-word driver and common source line recovery time according to the present invention.

FIG. 14 is a characteristic diagram for explaining the relation between the gate width of the p-channel MOSFETs of sub-word drivers and common source line recovery time. FIG. 14 illustrates an example of common source line recovery time. In a case where currents are not blocked, that is, power supply voltage VDD is supplied to the sources of the p-channel MOSFETs of sub-word drivers, the recovery time is zero as a matter of course but such a large leakage current as mentioned above is passed. As the characteristic of power supply interruption 1, the drawing shows a case where the sources of the p-channel MOSFETs of sub-word drivers are formed of independent source regions. As the characteristic of power supply interruption 2, the drawing shows a case where the sources of the driver MOSFETs for adjoining sub-word lines are formed of a common source region as in the embodiments illustrated in FIG. 2 and FIG. 10. Thus, commonality of a source region reduces the parasitic capacitance and the resistance of interconnection wiring; therefore, the common source line recovery time can be improved.

Figure 15:
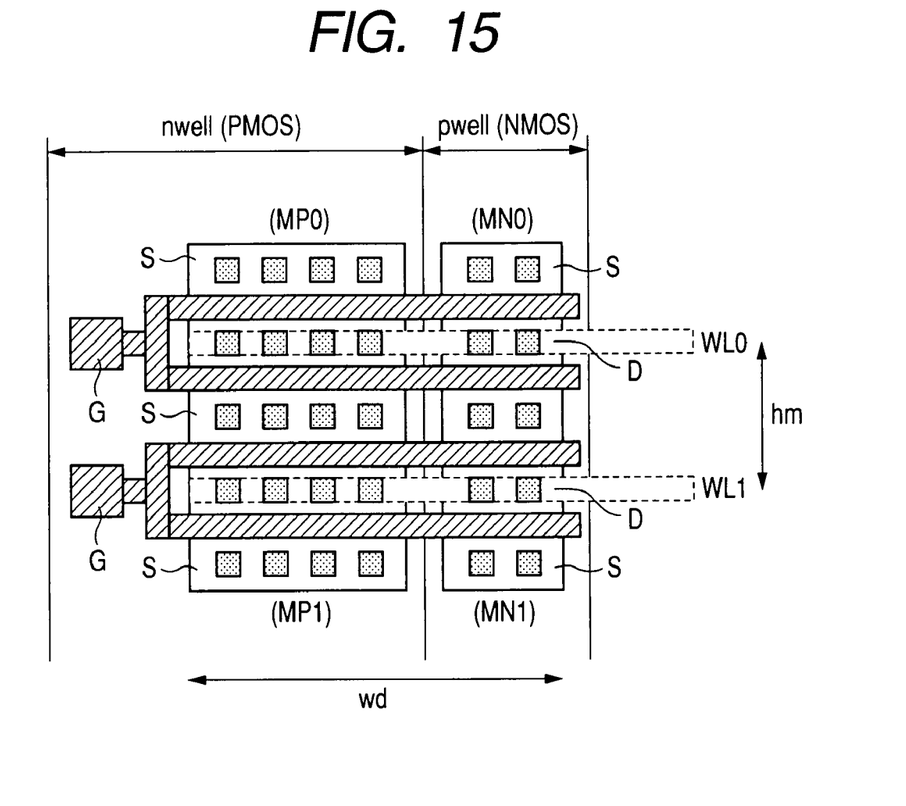
FIG. 15 is a layout chart illustrating another embodiment of a sub-word driver according to the present invention.

FIG. 15 is a layout chart of another embodiment of sub-word drivers. This drawing illustrating the embodiment shows two sub-word drivers corresponding to two sub-word lines WL0 and WL1 adjoining to each other. The gate electrodes of p-channel MOSFETs and n-channel MOSFETs are so formed that they are folded back. The semiconductor region sandwiched between the gate electrodes G folded back is used as drain regions D, which are respectively connected with word lines WL0 and WL1. The source regions S of either of the two p-channel MOSFETs and n-channel MOSFETs are used in common. The source regions S of the other are disposed on the upper side and the lower side. These source regions S are connected with the above-mentioned common source line, though not shown in the drawing. Also, in this embodiment, part of the common source of the two p-channel MOSFETs is used in common, as mentioned above. Therefore, the parasitic capacitance can be reduced similarly with the foregoing. In this embodiment, the gate voltages G are so formed that they are folded back, and their length in the direction of word line can be reduced to half. That is, in a case where there is an adequate margin in the pitch hn between the word lines WL0 and WL1, the length of a memory circuit in the direction of word line can be shortened by taking the following measure: the gate electrodes are so constructed that they are folded back, as in this embodiment.

Up to this point, the invention made by the present inventors has been specifically described with reference to embodiments. The invention as claimed in the application concerned is not limited to the above-mentioned embodiments, and various modifications can be made thereto without departing from the sprit and scope of the invention. Some examples will be taken. The above-mentioned blocking MOSFETs MP3 and so on may be so formed that their gate length is larger than that of the p-channel MOSFET MP01 and so on of sub-word drivers to reduce the leakage current passed through the source-drain paths. With respect to the number of word lines and bit lines that constitute the memory cell array of SRAM incorporated into a semiconductor integrated circuit device, various embodiments can be adopted. The present invention is applicable not only to SRAMs incorporated into system LSIs together with other elements but also to SRAMs as general-purpose memories. Aside from SRAMs, it is similarly applicable to word drivers provided in word lines of memory circuits, such as mask ROMs. The present invention can be widely used in semiconductor integrated circuit devices including memory circuits, such as the above-mentioned SRAMs and ROMs.

What is claimed is:

1. A semiconductor integrated circuit device, comprising:
a plurality of first word lines;
a plurality of second word lines that are extended in parallel with the first word lines and are plurally assigned to the first word lines;
a plurality of memory cells respectively connected with the second word lines;
a plurality of bit lines that are extended in a direction orthogonal to the second word lines and are electrically connected with memory cells corresponding to selected second word lines of a plurality of the second word lines; and
word drivers that select or deselect the second word lines, wherein the word drivers comprise first MOSFETs of first conductivity type and second MOSFETs of second conductivity type connected in series, the sources of the first MOSFETs are connected with the ground potential of a relevant circuit, the drains of the first MOSFETs and second MOSFETs, connected in common, are connected with the second word lines, the sources of the second MOSFETs are used as first selection terminals, and the gates of the first MOSFETs and the second MOSFETs, connected in common, are used as second selection terminals,
wherein the first selection terminals are supplied with first selection signals transmitted through the first word lines,
wherein the second selection terminals are supplied with second selection signals formed using address signals for selecting the bit lines,
wherein the first selection terminals of a plurality of word drivers including second word lines corresponding to selected bit lines are supplied with voltage corresponding to a level at which second word lines are selected,
wherein the first word lines are main word lines,
wherein the second word lines are sub-word lines that are divided in the direction of extension of the main word lines and are plurally assigned in the direction of extension of bit lines,
wherein the bit lines comprise complementary bit lines,
wherein the memory cells comprise static memory cells constructed of: storage portions in which the inputs and outputs of two CMOS inverter circuits are cross-connected; and selection MOSFETs that are provided between the storage portions and the complementary bit lines and whose gates are connected with the sub-word lines, and
wherein the second selection signals are selection signals that respectively correspond to a plurality of bit lines corresponding to sub-word lines divided in the direction of extension of the main word lines,
wherein the first selection terminals of the word drivers are supplied with the output signals of first CMOS inverter circuits that are plurally connected in common in correspondence with sub-word lines disposed adjacently to one another and receive selection signals corresponding to the first selection signals, and
wherein the second selection terminals of a plurality of the word drivers are supplied with drain output signals formed by a plurality of third MOSFETs of first conductivity type that are connected in series with resistance means provided on the power supply voltage side, whose sources are supplied in common with the input signals of the first CMOS inverter circuits, and whose gates are supplied with selection signals corresponding to the second selection signals.

2. The semiconductor integrated circuit device according to claim 1,
wherein the first MOSFETs and second MOSFETs comprise MOSFETs having a first threshold voltage,
wherein the resistance means comprises fourth MOSFETs of second conductivity type that are constantly kept on, and
wherein the MOSFETs that constitute the first CMOS inverter circuits and the third and fourth MOSFETs are formed using MOSFETs having a second threshold voltage higher than the first threshold voltage.

3. The semiconductor integrated circuit device according to claim 2,
wherein the first MOSFETs and second MOSFETs that constitute a plurality of the word drivers have linearly formed gate electrodes, and wherein the source regions of second MOSFETs that constitute two adjoining word drivers are formed of a common semiconductor region.

4. The semiconductor integrated circuit device according to claim 3,
wherein the first CMOS inverter circuits comprise fifth MOSFETs of first conductivity type and sixth MOSFETs of second conductivity type,
wherein the fifth and sixth MOSFETs are so formed that the sizes thereof are respectively equal to the sizes of the first MOSFETs and second MOSFETs, and respectively comprise two MOSFETs provided in some midportions between a plurality of the first MOSFETs and second MOSFETs, and
wherein the source regions of the each two MOSFETs are formed of a common semiconductor region.

5. The semiconductor integrated circuit device according to claim 4,
wherein the memory circuit has a plurality of memory mats corresponding to a plurality of sub-word lines divided in the direction of extension of the main word lines,
wherein the word drivers are disposed in mirror arrangement between two memory mats as a unit disposed in the direction of extension of the main word lines, and
wherein the second selection signals are selection signals for the memory mats.

6. The semiconductor integrated circuit device according to claim 5,
wherein the complementary bit lines are plurally divided in the direction of extension of complementary bit lines,
wherein the memory mats are constructed in correspondence with the divided complementary bit lines, and
wherein complementary bit line selection circuits corresponding to the individual memory mats are disposed in mirror arrangement between two memory mats as a unit disposed in the direction of extension of the main word lines.

7. The semiconductor integrated circuit device according to claim 6,
wherein the memory circuit is caused to operate on a power supply voltage of 1.2V,
wherein the first conductivity type is p-channel type, and
wherein the second conductivity type is n-channel type.

* * * * *